(12) United States Patent
Fang et al.

(10) Patent No.: US 7,405,615 B2
(45) Date of Patent: Jul. 29, 2008

(54) METHOD OF IMPULSE ACREAGE MODULATION DIGITAL POWER PROCESSING AND ITS DEVICE

(76) Inventors: Hutang Fang, No. 4 Box. Unit 1, 30 Building, South Section of Nanchang University, Nanchang, Jiangxi (CN) 330029; Hua Fang, No. 4 Box. Unit 1, 30 Building, South Section of Nanchang University, Nanchang, Jiangxi (CN) 330029

( * ) Notice: Subject to any disclaimer, the term of this patent is extended or adjusted under 35 U.S.C. 154(b) by 566 days.

(21) Appl. No.: 10/497,482

(22) PCT Filed: Dec. 3, 2002

(86) PCT No.: PCT/CN02/00864

§ 371 (c)(1),
(2), (4) Date: Nov. 15, 2004

(87) PCT Pub. No.: WO03/049290

PCT Pub. Date: Jun. 12, 2003

(65) Prior Publication Data

US 2005/0069049 A1    Mar. 31, 2005

(30) Foreign Application Priority Data

Dec. 3, 2001    (CN)    ................ 01 1 39786

(51) Int. Cl.
*H03F 3/38* (2006.01)
(52) U.S. Cl. .............. 330/10; 330/251; 330/207 A
(58) Field of Classification Search .............. 330/10, 330/207 A, 251; 375/238–239

See application file for complete search history.

(56) References Cited

U.S. PATENT DOCUMENTS

| 5,815,581 A * | 9/1998 | Andersson ............ 381/321 |
| 6,476,673 B2 * | 11/2002 | Takagishi ............ 330/10 |
| 2005/0069049 A1 | 3/2005 | Fang et al. |

FOREIGN PATENT DOCUMENTS

| WO | WO 95/34941 | 12/1995 |
| WO | WO 98/44626 | 10/1998 |
| WO | WO 99/20004 | 4/1999 |
| WO | WO 00/07291 | 2/2000 |
| WO | WO 03/049290 | 6/2003 |

* cited by examiner

*Primary Examiner*—Robert Pascal
*Assistant Examiner*—Hieu P Nguyen
(74) *Attorney, Agent, or Firm*—Davis Wright Tremaine LLP

(57) ABSTRACT

The present invention relates to a method and apparatus of processing digital power with pulse area modulation. This apparatus is composed of a front end circuit (1), a double limit delay comparison circuit (2), an integrating circuit (7), a drive circuit (3), a switching circuit (4), a power source (5) and a filter circuit (6). The double limits of signal and feedback comparison signal will be compared in the double limit delay comparison circuit. When the value of feedback comparison signal is greater than the upper limit, the double limit delay comparison circuit will output a low level. When the value of feedback comparison signal is smaller than the lower limit, the double limit delay comparison circuit will output a high level. Integrating circuit samples from the output of main switching circuit, and then sends a feedback signal (Y) to the double limit delay comparison circuit. The feedback signal is the average output of actual pulse area, which is consistent with signal (S) and also overlaps fluctuate showing whether pulse exists or not and being related to pulse.

9 Claims, 2 Drawing Sheets

US 7,405,615 B2

METHOD OF IMPULSE ACREAGE MODULATION DIGITAL POWER PROCESSING AND ITS DEVICE

TECHNICAL FIELD

This non-provisional application is a national stage application under 35 U.S.C. Section 371 of the International Patent Application No. PCT/CN02/00864 filed on Dec. 3, 2002, now WO 2003/049290 published on Dec. 6, 2003, which in turn claims priority of the Chinese Patent Application No. 01139786.1 filed on Dec. 3, 2001. The present invention generally relates to a method and apparatus of processing digital power with pulse area modulation.

BACKGROUND ART

There are two kinds of technologies available in the field of power converting process. One of which is analog technology, namely common-used analog power amplification, which converts DC power into the power in a signal form in the linear working area where a device operates. Because the efficiency of energy conversion is extremely low, for example for a power amplifier for class A, the efficiency of which is usually less than 30%, namely $\eta<30\%$. Most of energy is consumed and converted into heat energy, in order to improve efficiency and reduce heating, improvement has been made to analog power amplifier. Thus, a kind of power amplifier for class B is developed, theoretically its limit efficiency is 78%. Actually, it can only achieve about 50% at most. Well, the value of THD+N (Total Harmonic Distortion plus Noise) is more than 5%, and the distortion has not been accepted. Therefore, power amplifier for class AB1 and power amplifier for class AB2 were developed as compromise between class A and class B. In fact, power amplifier for class AB1 and class AB2 arc results film re-adjusting and redistributing power and distortion status of the power amplifier for class A and the power amplifier for class B. Usually, power amplifier that are made by using this kind of technology can achieve about 30% in efficiency (namely $\eta\approx30\%$), and 0.5% in THD. Now, this kind of technology is applied to most of power amplifiers.

The other one is digital technology. A common-used digital power amplifier is made by using this kind of technology. The specifics are as follows: all of its components are working under on-and-off status. So, their status can be expected It can achieve high efficiency. As to this point, digital technology is much better than analog technology. By adopting pulse width modulation technology, the digital power amplifier converts source power into series of pulse power under the control of signal. The product of duty of each pulse and pulse amplitude equals to the value of signal amplitude during the corresponding period (please see FIG. 1). Therefore, the spectrum of said series of pulse contains signal spectrum, and the power in signal form can be obtained with filtering. In theory, if the sample frequency is higher than the highest frequency component by two times, signal can be restored completely and signal power can be output under brand limit. Actually, due to the influence of such factors as various components' characteristic, driving, power source, temperature etc., pulse may subject to distort unpredictably. Thus, the distortion of this kind of power amplifier is too serious in practical application, and the approximate value of its THD can even reach up to 10% when outputting bigger signal.

In addition, theoretically, the power amplifier using pulse width modulation can be accurately realized and would not produce the result of distortion. However, because the on-and-off duration of apparatuses and circuit parameters lead inclination of front and back edge of pulse, and the voltage drops across the inner resistance of power source and switch components cause the inclination of the top of output pulse, as shown in FIG. 2, the actual pulse area ($S_0'$) doesn't equal to the ideal PWM area ($S_0$). This difference can be produced in each pulse. Eventually, wave distortion occurs. The higher the frequency is and the bigger the power is, therefore the more serious the distortion will be.

Now, in the field of electronic technology, the current status of power processing is that the efficiency of an analog power amplifier is too low, and the distortion of a digital power amplifier with pulse modulation is unacceptable.

SUMMARY OF THE INVENTION

The purpose of the present invention is to provide a method and apparatus of processing digital power with pulse area modulation so as to overcome the existing technical deficiency.

According to one aspect of the present invention, a method of processing digital power with pulse area modulation is proposed. A signal is converted into amplified power output after being passed through a front end circuit, a double limit delay comparison circuit, a drive circuit, a main switching circuit and a filter circuit; an integrating circuit samples from the output of the main switching circuit, and then outputs a feedback comparison signal to the double limit delay comparison circuit; comprising the steps of: preprocessing input signal in the front end circuit comparing the output signal from the front end circuit with the feedback comparison signal in the double limit delay comparison circuit, and when the value of the feedback comparison signal is greater than an upper limit, the double limit delay comparison circuit outputs low level, while when the value of the feedback comparison signal is smaller than a lower limit, the double limit delay comparison circuit outputs a high level; controlling the drive circuit by the level output from the double limit delay comparison circuit; converting power provided by the power source into an amplified pulse sequence by means of the switching circuit based on the output of the drive circuit; filtering the amplified pulse sequence with the filter circuit and then outputting amplified power, which is consistent with the signal; obtaining feedback comparison signal by sampling from the output of the main switching circuit by means of the integrating circuit.

According to the other aspect of this invention, an apparatus of processing digital power with pulse area modulation is proposed. The apparatus is composed of a front end circuit, a double limit delay comparison circuit, an integrating circuit, a drive circuit, a switching circuit, a main power source and a filter circuit, wherein signal is input from the input of the front end circuit; the output of the front end circuit connects to the input of the double limit delay comparison circuit; the output of the double limit delay comparison circuit connects to the input of the drive circuit; the output of the drive circuit connects to the input of the switching circuit; the output of the switching circuit is output as amplified power when being passing through the filter circuit; the input of the integrating circuit connects to the output of main switching circuit; the output of the integrating circuit is sent to the double limit delay comparison circuit; the main power source supplies electric power to main switching circuit, and then the electric power is converted into pulse sequence with signal spectrum in main switching circuit; the amplified pulse sequence is output after being filtered in the filter circuit; the integrating circuit samples from the output of main switching circuit so as to obtain pulse sequence signal; feedback signal from the integrating circuit is pulse sequence signal which is the average output of pulse area and is consistent with signal; the feedback signal being sent to the double limit delay comparison circuit.

BRIEF DESCRIPTION OF DRAWINGS

The specific function and characteristic of this invention will be further explained will examples and description attached. The following examples are used to describe this invention, not to set a limit to this invention, wherein.

DETAILED DESCRIPTION OF THE PREFERRED EMBODIMENTS

In the explanation of following examples, the same parts, which have the same or similar function, are indicated by the same reference signs, and will not be repeated.

Figure 3:
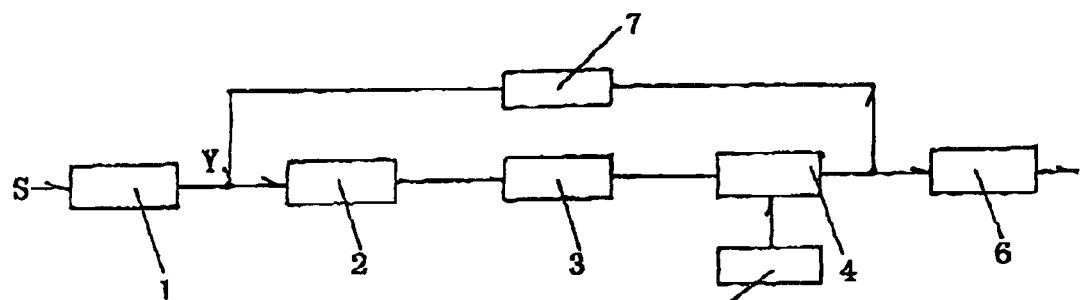
FIG. 3 shows the apparatus of processing digital power with pulse area modulation according to the first embodiment of the invention.

The apparatus of processing digital power with pulse area modulation according to the first embodiment of the invention, shown in FIG. 3, is composed of a front end circuit 1, a double limit delay comparison circuit 2, an integrating circuit 7, a drive circuit 3, a switching circuit 4 and a filter circuit 6, a power source 5 which supplies energy to the switching circuit 4.

Figure 1:
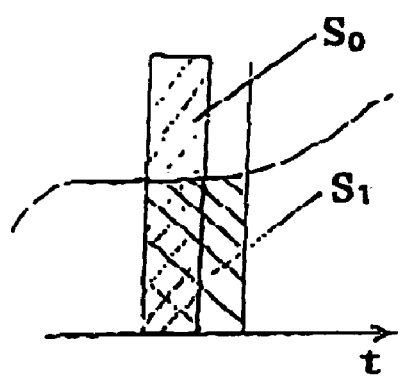
FIG. 1 shows the operating principle of a digital power amplifier with pulse width modulation.
Figure 2:
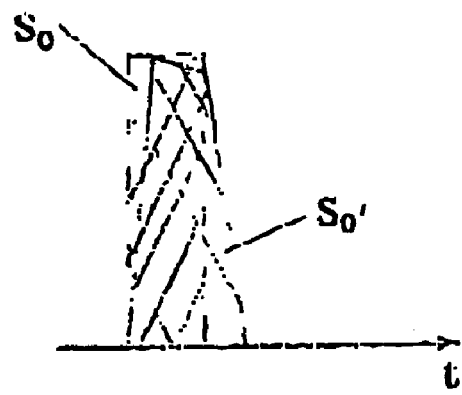
FIG. 2 shows the reason of distortion of a digital power amplifier with pulse width modulation.
Figure 4:
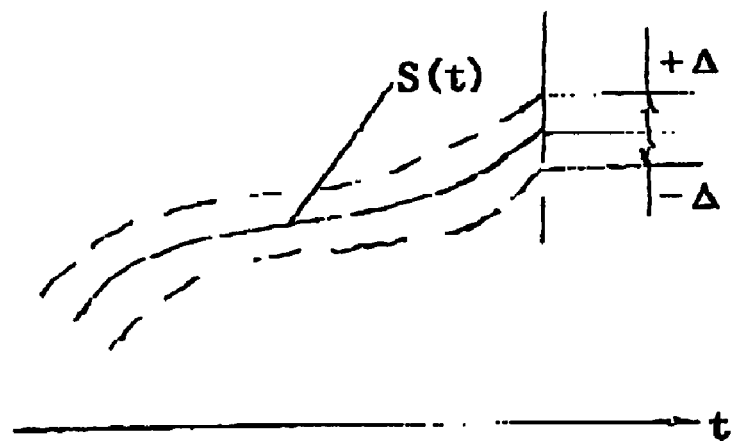
FIG. 4 shows operating status of double limit comparison circuit.

The signal S from the input of the front end circuit 1 will be supplied to the double limit delay comparison circuit 2 after being preprocessed in the front end circuit 1. The integrating circuit 7 supplies a feedback comparison signal Y to the double limit delay comparison circuit 2. Then, the above-mentioned two signals (S, Y) will be compared in the double limit delay comparison circuit 2 and their output status will be determined finally. At any moment, when the value of feedback comparison signal is greater than the value of S (t)+Δ, as shown in FIG. 4, the double limit delay comparison circuit 2 will output low level, when the value of feedback comparison signal is smaller than the value of S (t)−Δ, the double limit delay comparison circuit 2 will output high level. The output thus obtained of the double limit comparison circuit is provided to and pass with the drive circuit 3 and then to control the switching component of the switching circuit 4 so that the electric power supplied by the power source 5 is converted into amplified pulse output with the characteristic of input signal (S) and output after being filtered in the filter circuit 6.

At the same time, the integrating circuit 7 samples from the output of the main switching circuit 4 and outputs a feedback signal Y to the double limit delay comparison circuit. The feedback signal Y from the integrating circuit 7 is the average output of actual pulse area, which is consistent with signal S and also overlaps fluctuate showing whether pulse exists or not and being related to pulse.

Figure 5:
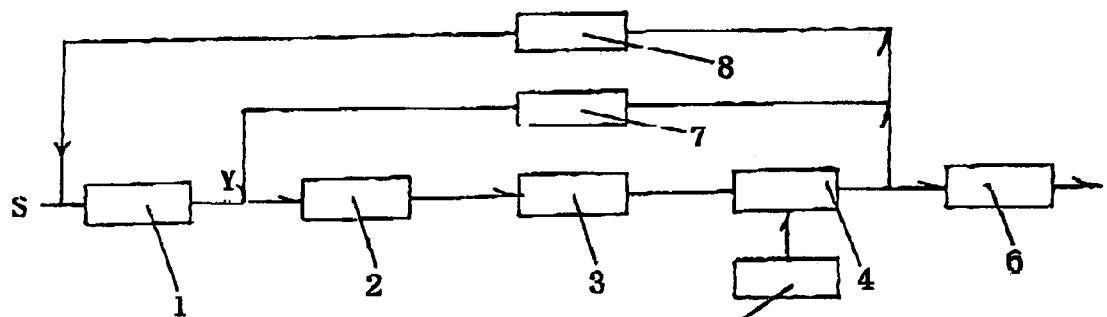
FIG. 5 shows the apparatus of processing digital power with pulse area modulation according to the second embodiment of the invention.

In the second embodiment of the present invention as shown in FIG. 5, the apparatus of processing digital power with pulse area modulation is composed of a front end circuit 1, a double limit delay comparison circuit 2, an integrating circuit 7, a drive circuit 3, a switching circuit 4, a feedback network 8 and filter circuit 6, a main power source 5 which supplies energy to the switching circuit 4. The feedback network 8 samples from the output of the switching circuit 4 and then feeds it back to the input of the front end circuit 1. Thus, negative feedback comes into forth, and the effect of processing the digital power will be improved.

Figure 6:
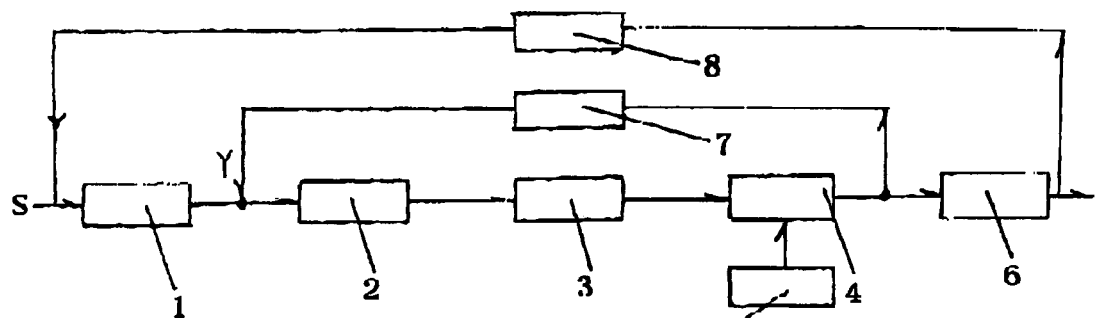
FIG. 6 shows the apparatus of processing digital power with pulse area modulation according to the third embodiment of the invention.

In the third embodiment of the invention as shown in FIG. 6, the apparatus of processing digital power with pulse area modulation is composed of a front end circuit 1, a double limit delay comparison circuit 2, an integrating circuit 7, a drive circuit 3, a switching circuit 4, a feedback network 8 and a filter circuit 6, a main power source 5 which supplies energy to the switching circuit 4. The feedback network 8 samples from the output of the filter circuit 6 and then feeds the sampled signal back to the input of the front end circuit 1. Thus, negative feedback comes into forth, and the effect of processing the digital power will be improved.

In each embodiment of the invention, following circuits are used, wherein:

A front end circuit: this circuit is usually composed of a linear operational amplifier with low input impedance and gain of +1 and a linear operational amplifier with a certain gain. The front end circuit of the present invention can not only minimize thermal noise introduced but also amplify input signal to certain extent. The amplified signal thus obtained can be sent to a subsequent double limit delay comparison circuit.

A double limit delay comparison circuit: this kind of comparison circuit is different from others. In common comparison circuit, feedback signal is directly compared with input signal. However, in the comparison circuit of the present invention, feedback signal is compared with levels of either input signal +Δ or input signal −Δ. More particularly, when the value of feedback signal increases, the value of Δ will be added to input signal, the feedback signal will not be compared with the input signal directly until input signal +Δ is reached. If the value of the feedback signal is greater than input signal +Δ, the double limit delay comparison circuit will output low level. On the other hand, when the value of feedback signal decreases, the value of Δ will be cut down on input signal. The feedback signal will not be compared with the input signal directly until input signal −Δ is reached. If the value of the feedback signal is smaller than input signal −Δ, the double limit delay comparison circuit will output high level. Because output level cannot be changed in this comparison circuit before the upper limit or the lower limit (±Δ) is reached, the comparison circuit of the present invention can be called a double limit delay comparison circuit. The output of the double limit delay comparison circuit controls the drive circuit.

A drive circuit: this circuit is used to control ON or OFF of the switching apparatuses. It is required that the drive circuit should have the capacity of supplying current and absorbing current. Therefore, the drive circuit is usually structured according to Totem Pole. The output of The drive circuit controls the switching circuit.

A switching circuit: the output of the drive circuit controls the ON or OFF status of the switching circuit. Common-used switching apparatuses include a MOSFEIT (Metal-Oxide Semiconductor Field-Effect-Transistor), and IGBT (Insulation Grid Bipolar Transistor), all of which are field-controlled apparatuses requiring a small driving power and rapid onand-off speed. These apparatuses are applied to constructing a half-bridge circuit or a full-bridge circuit.

A power source circuit: the present invention concerns a power amplifier, which effectively converts the power of the source into signal power output with the switching circuit. The source circuit is just used to supply DC power for this.

A filter circuit: because the output from the switching circuit is a series of switching waves, which contain not only signal spectrum but also undesirable switching spectrum whose frequency is much higher than signal frequency, low-pass filter is applied to filter these switching spectrum, thus ensuring only signal spectrum to be output. In the present invention, the maximum plain low-pass filter circuit, or a Chebykshev filter circuit or an elliptic function filter circuit can be applied.

A feedback network: After the integrating circuit samples from the output of main switching circuit, overlapped signal of average output signal of pulse area and pulse sequence signal that is consistent with switching signal call be obtained. This overlapped signal is the feedback comparison signal from the feedback network, which will be sent to the double limit delay comparison circuit to be compared with signal $\pm\Delta$.

In above-mentioned examples, $+\Delta$ and $-\Delta$ are symmetrical. The average value of pulse area accurately represents signal. So, the distortion of 0.1% can be achieved easily.

In above-mentioned examples, noise is distributed widely, the average amplitude of noise is very low and there is no noise with constant frequency as PWM digital power amplifier has.

What is claimed is:

1. A method of processing digital power with pulse area modulation, wherein an input signal is used for controlling power conversion into amplified power output after the input signal is being passed through a front end circuit, a double limit delay comparison circuit, a drive circuit, a switching circuit and a filter circuit, and wherein an integrating circuit samples from an output of the switching circuit, and then outputs a feedback comparison signal to the double limit delay comparison circuit; comprising the steps of:

preprocessing the input signal in the front end circuit;

comparing an output signal from the front end circuit with the feedback comparison signal in the double limit delay comparison circuit, and wherein when the value of the feedback comparison signal is greater than a predetermined upper limit, the double limit delay comparison circuit outputs a low level signal, while when the value of the feedback comparison signal is smaller than a predetermined lower limit different from the upper limit, the double limit delay comparison circuit outputs a high level signal;

controlling the drive circuit by the level output from the double limit delay comparison circuit;

converting power provided by the power source into an amplified pulse sequence by means of the switching circuit based on an output of the drive circuit;

filtering the amplified pulse sequence by the filter circuit and then outputting amplified power;

obtaining the feedback comparison signal by sampling from the output of the switching circuit by means of the integrating circuit.

2. A method according to claim 1 characterized in that the double limits indicate the upper limit and the lower limit of $S(t)\pm\Delta$, the upper limit being the values of $S(t)+\Delta$, and the lower limit being the value of $S(t)-\Delta$.

3. A method according to claim 1 characterized in that samples from the output of the switching circuit are fed back to the input of front end circuit via a feedback network so as to form a negative feedback.

4. A method according to claim 1 characterized in that samples from the output of the filter circuit are fed back to the input of the front end circuit via a feedback network so as to form a negative feedback.

5. A method according to claim 2 characterized in that the value $\Delta$ of the upper limit and the value $-\Delta$ of the lower limit are symmetrical.

6. An apparatus of processing digital power with pulse area modulation, comprising: a front end circuit, a double limit delay comparison circuit, an integrating circuit, a drive circuit, a switching circuit, a power source and a filter circuit, wherein an input signal is input from an input of the front end circuit; an output of the front end circuit is connected to an input of the double limit delay comparison circuit; an output of the double limit delay comparison circuit is connected to an input of the drive circuit; an output of the drive circuit is connected to an input of the switching circuit; an output of the switching circuit is outputted as amplified power after being passing through the filter circuit; an input of the integrating circuit is connected to the output of switching circuit; an output of the integrating circuit is connected to the double limit delay comparison circuit; and wherein the power source supplies electric power to the switching circuit, and then the electric power is converted into an amplified pulse sequence with a signal spectrum in the switching circuit; the amplified pulse sequence being filtered in the filter circuit to provide an output of the apparatus; the integrating circuit sampling from the output of the switching circuit so as to obtain a feedback signal which provides an indication of an average of pulse area; the feedback signal being sent to the double limit delay comparison circuit, said double limit delay comparison circuit having two different predetermined limit values.

7. An apparatus according to claim 6 characterized in that the double limit delay comparison circuit outputs a low level signal when the pulse signal is grater than a first predetermined value, and outputs a high level signal when the pulse signal is smaller than a second predetermined value different from the first predetermined value.

8. An apparatus according to claim 6 characterized in that it further comprises a feedback network, an input of which being connected to the output of the switching circuit, for sampling the output of the switching circuit, and an output of which being connected to the input of the front end circuit for feeding the signal sampled from the switching circuit back to the input of the front end circuit.

9. An apparatus according to claim 6 characterized in that it further comprises a feedback network, an input of which being connected to the output of the filter circuit for sampling from an output of the filter circuit, and the output of which being connected to the input of the front end circuit for feeding the signal sampled from the filter circuit back to the input of the front end circuit.

* * * * *